United States Patent [19]

Koltz

[11] Patent Number: 5,659,385
[45] Date of Patent: Aug. 19, 1997

[54] USING PAPER NEGATIVES IN DIGITAL IMAGESETTING

[76] Inventor: Bradley M. Koltz, 140 Railroad Ave., South Hamilton, Mass. 01982

[21] Appl. No.: 399,776

[22] Filed: Mar. 7, 1995

[51] Int. Cl.$^6$ .......................... G03B 27/32; G03B 21/60; H04N 1/23
[52] U.S. Cl. .................. 355/77; 355/80; 355/85; 358/298; 358/456; 358/459
[58] Field of Search .................. 355/67, 85, 69, 355/18, 71, 75, 77, 79, 80, 81; 358/296, 298, 299, 533, 534, 535, 536, 454–459, 461, 462; 101/450.1, 451, 453, 463.1

[56] References Cited

U.S. PATENT DOCUMENTS

| | | | |
|---|---|---|---|
| 3,696,717 | 10/1972 | Horma et al. | 95/4.5 |
| 3,742,129 | 6/1973 | Roberts et al. | 178/5.4 |
| 3,913,477 | 10/1975 | Howland et al. | 101/211 |
| 4,017,183 | 4/1977 | Lenz et al. | 355/85 |
| 4,220,410 | 9/1980 | Bloodgood | 355/18 |
| 4,296,197 | 10/1981 | Stevie | 430/300 |
| 4,636,066 | 1/1987 | Kanada et al. | 355/77 |
| 4,758,866 | 7/1988 | Rylander | 358/80 |
| 4,924,301 | 5/1990 | Surbrook | 358/75 |
| 5,166,809 | 11/1992 | Surbrook | 358/456 |
| 5,170,257 | 12/1992 | Burns | 358/298 |
| 5,213,043 | 5/1993 | Reimers et al. | 101/463.1 |
| 5,250,982 | 10/1993 | Schoon | 355/78 |
| 5,257,097 | 10/1993 | Pineau et al. | 358/500 |
| 5,345,870 | 9/1994 | Bailey et al. | 101/463.1 |
| 5,548,407 | 8/1996 | VonKienlin et al. | 358/298 |

OTHER PUBLICATIONS

Mortiz, Brad, "Essex County Improved Upon and Old Idea, Saves $24,000," May 1994, Newspapers and Technology (USA).
Koltz, Bradley M., "A Sample Breakthrough", Mar. 20, 1994, Seybold Speech slides (USA).
Koltz, Bradley M., "Nextwaving —Part 2: Project Briefings" (brook excerpt) Mar. 18, 1994 (USA).

*Primary Examiner*—Matthew S. Smith
*Assistant Examiner*—Herbert V. Kerner
*Attorney, Agent, or Firm*—Fish & Richardson P.C.

[57] ABSTRACT

A process for making a printing plate includes composing a digital image of a page to be printed including at least one halftone image. Load imagesetting paper in an imagesetter. Operate the imagesetter to print a paper negative of the digital image on the imagesetting paper. Expose the paper negative to a printing plate.

14 Claims, 3 Drawing Sheets

REGISTER TARGETS ARE MOUNTED ONTO LIGHT TABLE WITH HOLE PUNCH.

REGISTER TARGETS ARE EMBEDDED IN PAGE.

EMBEDDED REGISTER TARGETS ARE NOTCHED TO ALLOW VIEW BEHIND, OR "THROUGH" THE PAGE.

PAGE IS ALIGNED WITH LIGHT TABLE BY ALIGNING TARGETS, USING CUT-OUT, SEE THROUGH PORTIONS AS GUIDE.

USING PAPER NEGATIVES IN DIGITAL IMAGESETTING

This invention generally relates to digital typesetting, imagesetting, and printing. The invention more specifically relates to processes for making printing plates from digital page images.

Digital imagesetting is widely used in the printing industry. For example, many commercial newspapers use digital imagesetting to automate production of newspaper printing plates. A computer stores text, images, and halftones of photographs. The computer is used to compose the visual appearance of one or more complete newspaper pages, resulting in digital page image data. The page image data is sent to a raster image processor, which converts the page image data into a bitmap for controlling an imagesetting laser. The bitmap is sent to a digital imagesetter which contains a laser for selectively exposing a cassette of film. Under computer control, guided by the bitmap, the laser "draws" a page image on the film. The film is developed, creating a fine-resolution negative image. The film is used as a mask to expose or "burn" a metal printing plate. The plate is placed on a press, inked, and used to print hundreds, thousands or millions of individual newspaper pages.

Although this process is well suited to high-volume printing, such as the printing volume encountered by major metropolitan newspapers or commercial offset printers, it requires using large quantities of expensive imagesetting film as an intermediate image transfer medium.

Also, developing imagesetting film takes a long time, preventing printers from reducing the overall press cycle.

It is an object of the invention to provide improved digital imagesetting.

In general, in one aspect, the invention provides a process for making a printing plate, comprising the steps of (a.) composing a digital image of a page to be printed; (b.) loading imagesetting paper in an imagesetter; (c.) operating the imagesetter to print a paper negative of the digital image on the imagesetting paper; and (d.) exposing the paper negative to a printing plate.

In another aspect, the invention features the following additional substeps: (a1) in each halftone, digitally increasing the size of each highlight dot by approximately five percent (5%), and reducing shadow values by 5% (the amount depends upon subjective values as well as the factors of plate burner light intensity, the specific brand plate's sensitivity to light, the image density on the negative, and paper opacity); (b1) configuring a raster image processor (RIP), coupled to the imagesetter, for negative output; (c1) increasing the intensity of a laser in the imagesetter; (d1) increasing the exposure time of the paper negative by an amount approximately equal to the difference in opacity of the imagesetting paper compared to imagesetting film.

In another aspect, the invention provides, in a digital imagesetting system comprising a page data source, a raster image processor (RIP) coupled to the data source, an imagesetter coupled to and controlled by the RIP, and a plate burner, a process for making a printing plate, comprising the steps of (a) digitally composing an image of a page to be printed; (b) configuring the RIP for negative output to the imagesetter; (c) loading imagesetting paper in the imagesetter; (d) operating the RIP and imagesetter to expose and create a paper negative of the data source on the imagesetting paper; e. developing the paper negative; and f. exposing the paper negative to a printing plate.

Other objects, features and advantages of the invention will become apparent from the following detailed description when read in connection with the accompanying drawings in which.

FIGS. 3, 4, 5, and 6 are diagrams showing and describing a method of color registration of paper negatives.

The digital imageset paper negative process uses imagesetting paper, also known as positive galley film or RC paper, to replace imagesetting film in making printing plates.

The main benefits to this are the reduction in cost in going from film to paper of from about $2.25 to about 60 cents, as well as reduced processing time paper requires versus film (resulting in savings of about 10 seconds per page).

Figure 1:
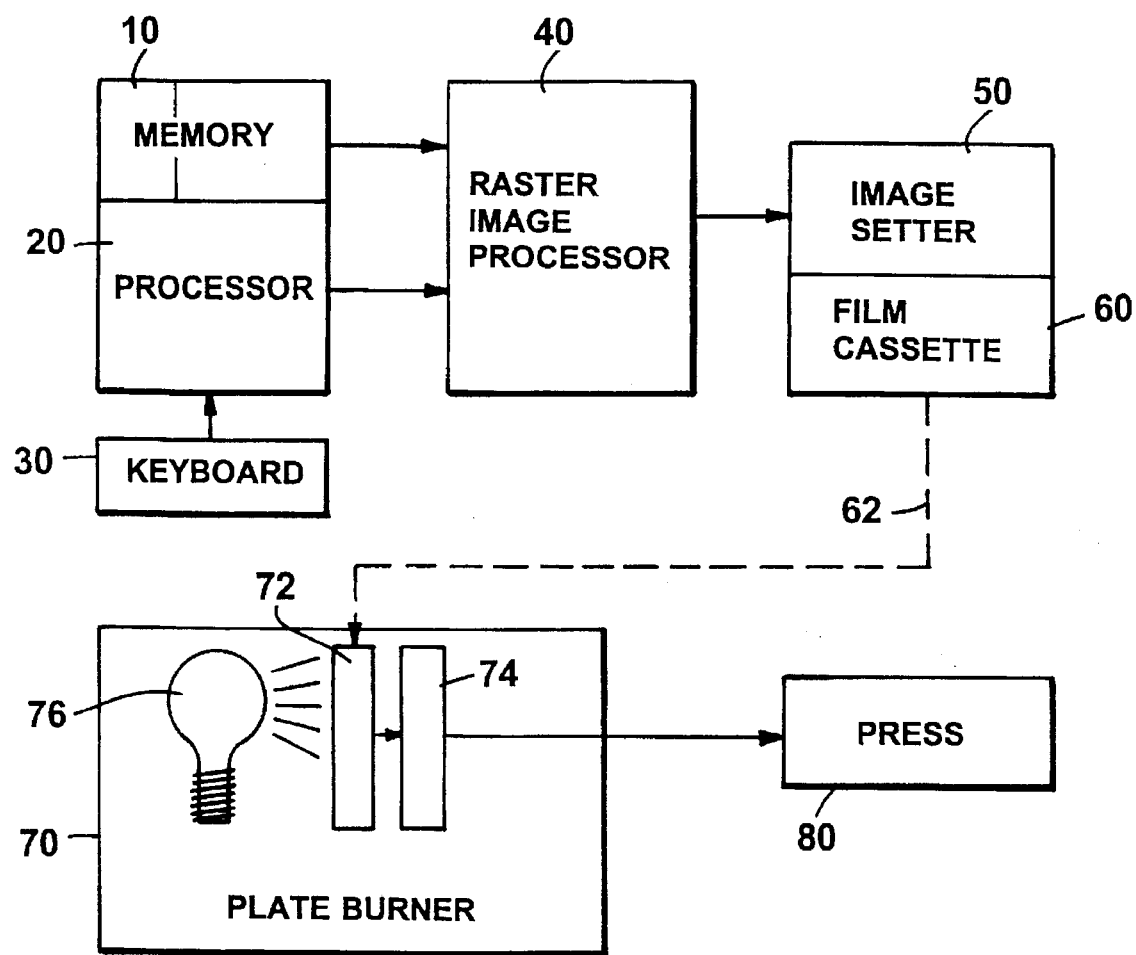
FIG. 1 is a block diagram of components of a digital imagesetting system.

With reference now to the drawings and more particularly FIG. 1, there is shown a block diagram illustrating the logical arrangement of conventional digital imagesetting equipment typically used in publishing daily newspapers. In general, as shown in FIG. 1, a digital imagesetting system comprises page data 10 in a digital memory of a composing processor 20. The page data 10 represents one or more complete newspaper pages, or other data to be printed. The page data can comprise text, graphic images, halftones (encoded photographic images), or other matter.

The composing processor has numerous data inputs for controlling the visual appearance of the page data. For example, the composing processor has a halftone highlight dot size input. Using a computer keyboard 30 coupled to this input, an operator can adjust the highlight dot size used to generate halftone images. This adjustment may also be done at the RIP if the RIP software offers such control. This input permits the operator to compensate for changes in the quality of imagesetting film, newsprint paper, and other downstream steps which can affect the readability of halftone images.

The composing processor and the page data are coupled to a Raster Image Processor (RIP) 40. The RIP is a digital device which converts the page data into a bitmap to guide an imagesetting laser in an imagesetter 50. The RIP can be configured by an operator to generate positive images (printed matter is black on a white background) or negative images (printed matter is white on a black background). Also, the RIP can be configured to generate normally readable output or reverse (mirror image) output. This may also be controlled by settings at the composition workstation. The imagesetter contains a cassette 60 holding a roll or sheet of light-sensitive film. In operation, as is known in the art, a laser in the imagesetter 50 draws an image of the printed page on the film under computer control. The film is removed from the imagesetter 50 and developed into a negative imageset film.

The positive imageset film is then taken (as shown by path 62) to a plate burner machine 70. The film 72 is placed in contact with a thin metal printing plate 74. In some applications, a Mylar plate is used. The plate 74 is exposed by directing high intensity ultraviolet light 76 through the film onto the plate, thereby etching the plate with a negative page image. Plate burning systems may use light sources other than ultraviolet, and this process will work with such systems. Conventional plate burners permit the operator to adjust the exposure time (or "burn time") to compensate for different types of printing plates.

The film is removed and the etched coating is removed with a solvent, resulting in a final negative plate. The plate is placed on a printing press 80, inked, and used to contact print final positive newspaper pages.

The devices shown in FIG. 1 may be connected using a computer network, or data may be passed among the devices by disk, modem, or other data transmission means. Images on pages may be scanned, created electronically, or delivered via disk, compact disk (CD), or other transmission means.

Figure 2:
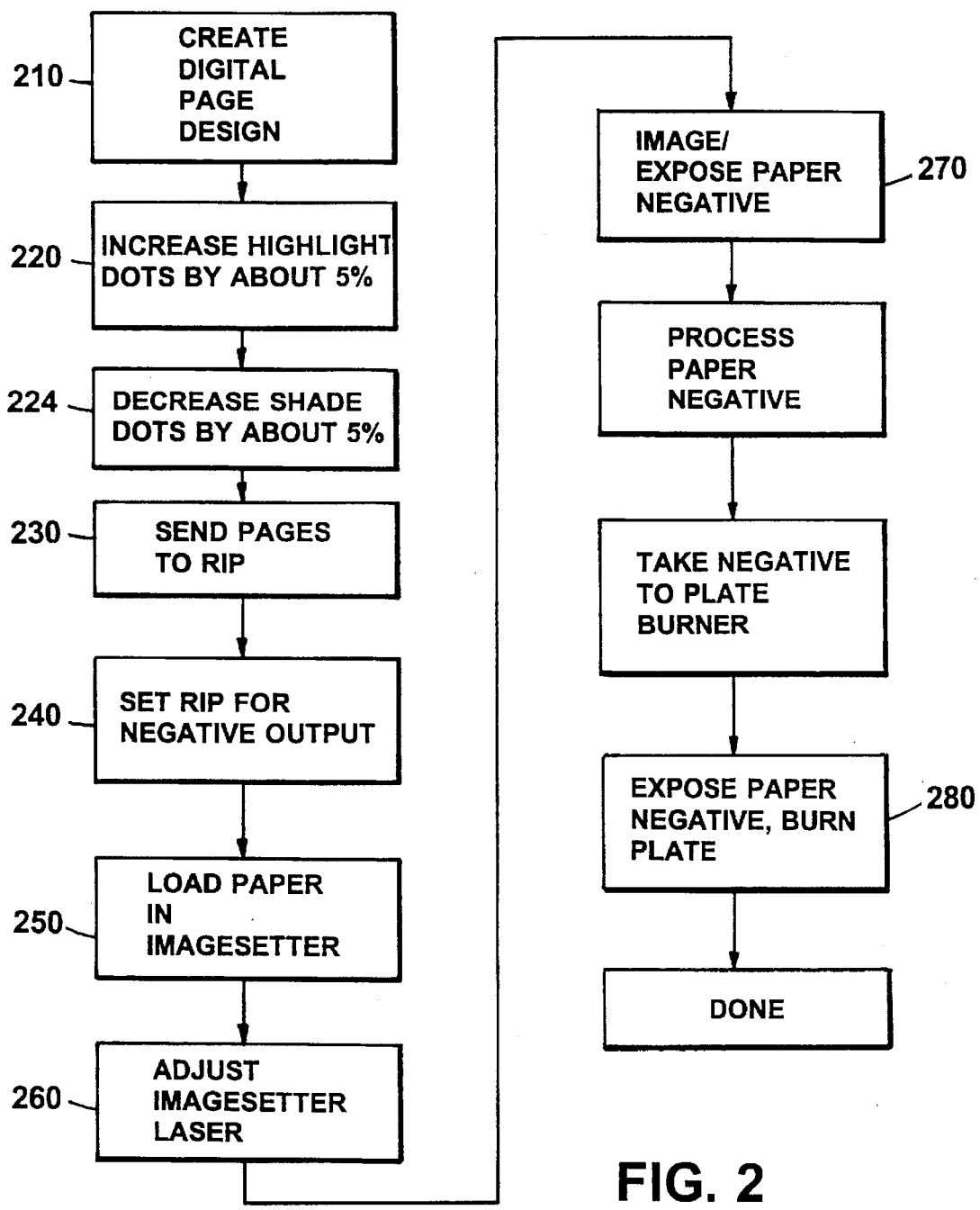
FIG. 2 is a flow diagram of a process according to the invention using paper negatives in digital imagesetting.
Figure 3:
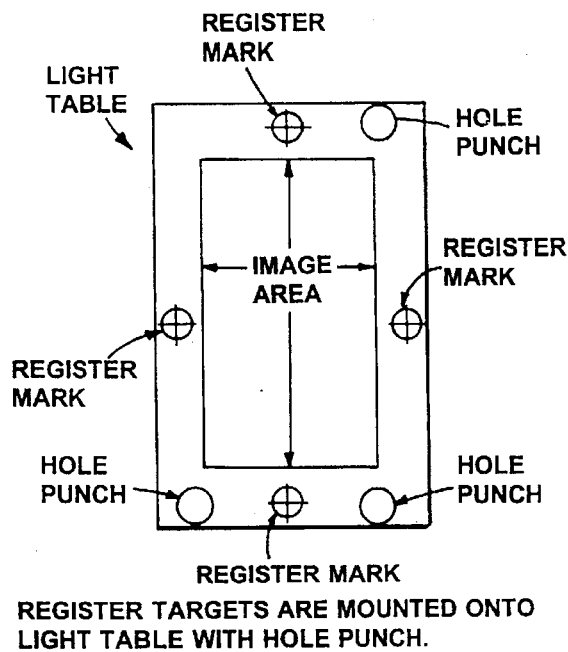
Figure 4:
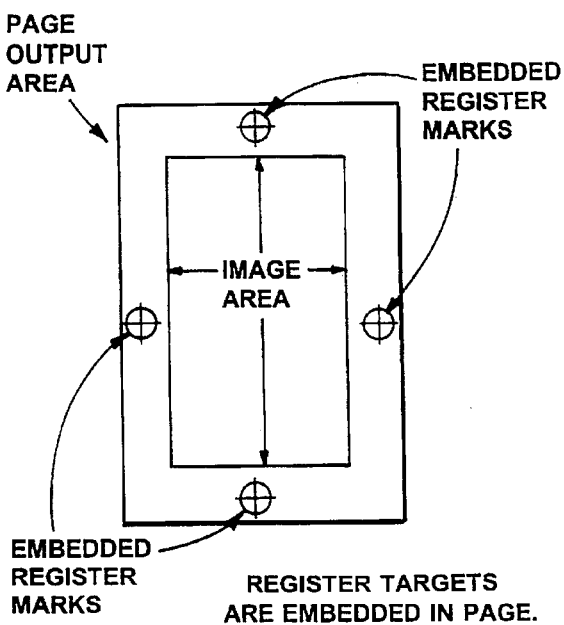
Figure 5:
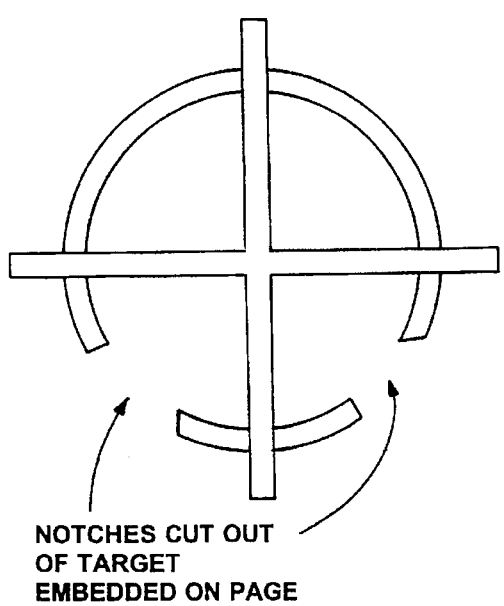
Figure 6:
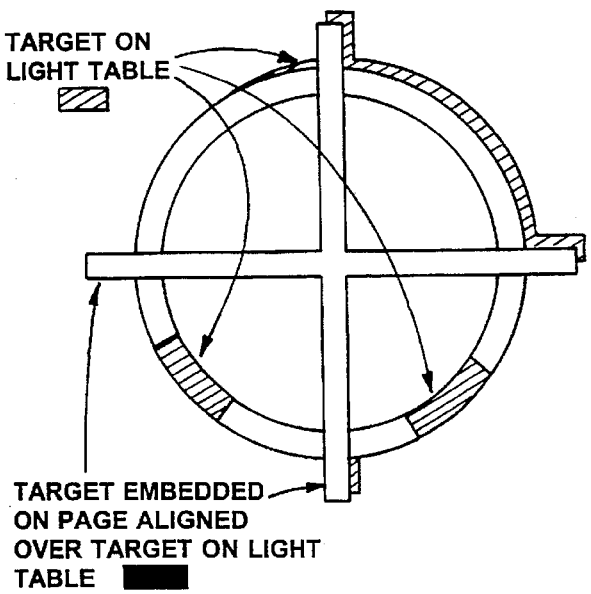

Referring now to FIG. 2, there is shown a digital imageset paper negative process according to the invention. The process can be used with the equipment shown in FIG. 1.

In a first step of the process, as shown in block 210, an operator creates a digital page design using a composing computer or terminal. Text, graphic images, and/or halftones are digitally created and composed into an image to be printed, such as a complete newspaper page.

Optionally, as shown in block 220, for each halftone in the image (if any), the highlight dot size is increased about 5%. This is generally necessary because this process results in a slight loss of dot fidelity below 5%. The amount of change (5%) in this step is optional, primarily because highlight quality is a subjective judgment dependent on the skill and perception of the operator. As shown in block 224, the shadow dot is decreased by about 5% to allow for the added burn time and/or intensity associated with this process, and to thus prevent shadow detail areas of images from being over-exposed. Such over exposure will cause reproduction that is too dark.

The highlight and shadow adjustments are also dependent upon dot gain at the press. A more sensitive press may require greater or lesser adjustments of the highlight and shadow dot settings.

Next, as shown in block 230, the image is digitally sent to the raster image processor (RIP) in the form of one or more digital pages.

As shown in block 240, the page output is sent as negative, or the RIP is configured for negative output, i.e., to imageset film negatives. Many RIPs will not properly reverse embedded elements in a page sent as positive. To get a negative, it is recommended that the RIP be configured as negative, or that software that provides for conversion of the embedded elements to negative be used.

Then, as shown in block 250, the imagesetter is loaded with imagesetting paper instead of film.

As shown in block 260, the intensity of the imagesetter laser is increased slightly to compensate for the fact that imagesetting paper has slightly less photographic sensitivity than imagesetting film.

As shown in block 270, a paper negative is imaged instead of a film negative. The paper negative is sent through a film processor to develop it, and provided to the plate burner.

Imagesetting paper commercially available from Agfa, Anitec, and Kodak will work in this process. Purer base papers are preferred as impurities can diffract light and degrade reproduction quality. Imagesetting paper should have an opacity providing density minimum to maximum variance of 1.5 or more, and a density minimum of no more than 0.75 and a density maximum no less than about 1.9.

Next, as shown in block 280, the paper negative is exposed to the plate on the UV plate burner. The exposure time and/or exposure intensity of the plate burner is made slightly greater than that used for regular film, to account for the greater opacity of a paper negative compared to a film negative. The paper negative is placed, emulsion down, on the plate surface to control the diffusion of light through the paper. The specific amount of change is dependent upon the factors of light intensity, the plate's sensitivity to light, the image density, and paper opacity. When the UV light source is turned on, UV light passes through the paper base and exposes the plate wherever there is no image in the same manner as for a film negative.

The burn time on the plate burner is increased by a percentage commensurate with the sensitivity of the plates being used. High sensitivity UV plates, including industry standard subtractive plates, work well when the page image contains text, halftones, and process color material. Older additive-type plates work with halftones, but pose greater difficulty with process color or stochastic (modulated frequency) screening.

The following table lists one possible combination of imagesetter intensity, halftone dot generation, and plate exposure values:

Table of Settings and Values

Halftone highlights: adjusted+5%
Midtone values: unchanged
Shadow values: adjusted−5%
Harlequin RIP: set to square or euclidean dot; set to negative
Pelbox helium neon laser intensity: set to 9
Page composition software set to positive page
Image format is Tagged Image File Format (TIFF)
LogeE processor using FUJI Hunt rapid access chemistry (Chempact); set at 90 degrees F.; process speed set at 20 seconds
NuArc UV plateburner set at 24 burn units
Anitec helium neon imageset paper
Anitec paper output results D-MIN of 0.50 and D-MAX of 2.20
Press is a GOSS Urbanite; press dot gain of approx. 25%; press prints yellow dilitho and yellow has a dot gain of 42%

This invention is easily used in conjunction with camera-ready or late-arriving material that has not been processed through the digital composition process as other material on a given page. This is important to enable a printer to integrate material which arrives at the printer just before the press deadline. Material can be hand stripped in, using transparent tape to hold the material in place and non-transparent tape to seal any light gaps. Also, material which was missing at the time of page composition can be scanned in and placed on the page prior to raster image processing. Alternatively, a mask can be made of the page, and the missing material can be placed in the masked area later, either manually or electronically.

The method of this invention is also readily used with "dilitho" printing. Some printers seek to maximize the number of press units available by printing "dilitho," or directly from a plate. In that process, the image on the plate must be the reverse of the images printed from plate to offset blanket. For this method, when color separations are made, the dilitho color should be printed reverse, wrong reading (if normal pages are printed non-reverse, right reading) or vice versa. Without doing this, the dilitho image will have to be reversed ("flopped") at the plate burner, without the emulsion side down. This may cause excessive dot gain as light will diffuse through the base material before etching the plate.

This invention is also compatible with color registration methods. Use of output devices fitted with punch systems is ideal for color registration. However, many output devices do not have such punch systems. Therefore, pages should have some identifying markings to allow the person operating the plate burner to register the colors. One method is to include a large target just outside the plate/press image area on the negatives; the target is easily seen and used to line up pages by direct vision ("eye-bailing"). Alternatively, a target strip can be included for mechanical alignment systems. Or a master target can be placed on a light table, and each negative, also containing the target or targets, can be aligned and registered against this master.

(If the paper is hard to see through, the targets may have slices cut from them [if round] so that a target begins on the top sheet, continues through a gap on the sheet that has been cut out, but that also exists on the bottom master, and then continues on the top sheet. This procedure is also shown and described in FIGS. 3, 4, 5, and 6.)

This invention will work with any output method that delivers consistent dots at a sufficient spot size and consistency, and within a consistent desired density range. Such output devices include toner, thermal or other output devices using paper besides imagesetters.

The invention is not limited to high-volume newspaper production but is usable in any printing application in which plates are created.

Other embodiments are within the claims.

What is claimed is:

1. A process for making a printing plate including at least one halftone image formed by highlight dots and shadow dots, comprising:
   a. composing a digital image including said at least one halftone image of a page to be printed;
   b. loading imagesetting paper in an imagesetter;
   c. operating the imagesetter to print a paper negative of the digital image on the imagesetting paper; and
   d. exposing the paper negative to a printing plate, wherein composing further includes:
   (a1) in each halftone, increasing the size of each highlight dot and decreasing the size of each shadow dot.

2. The process recited in claim 1, wherein loading further includes:
   (b1) configuring a raster image processor (RIP), coupled to the imagesetter, for negative output.

3. The process recited in claim 1, wherein said imagesetter includes a laser and operating the imagesetter further includes:
   (c1) increasing the intensity of the laser in the imagesetter.

4. The process recited in claim 1, wherein exposing further includes:
   (d1) increasing the exposure time of the paper negative by an amount approximately equal to the difference in opacity of the imagesetting paper compared to imagesetting film.

5. The process recited in claim 1, wherein exposing further includes:
   (d1) increasing the exposure intensity of the paper negative by an amount approximately equal to the difference in opacity of the imagesetting paper compared to imagesetting film.

6. The process recited in claim 1 wherein composing further includes increasing the size of each highlight dot by approximately five percent and decreasing the size of each shadow dot by approximately five percent.

7. In a digital imagesetting system comprising a page data source, a raster image processor (RIP) coupled to the data source, an imagesetter coupled to and controlled by the RIP, and a plate burner, a process for making a printing plate including at least one halftone image formed by highlight dots and shadow dots, comprising the steps of:
   a. digitally composing an image including said at least one halftone image of a page to be printed;
   b. configuring the RIP for negative output to the imagesetter;
   c. loading imagesetting paper in the imagesetter;
   d. operating the RIP and imagesetter to expose and create a paper negative of the data source on the imagesetting paper;
   e. developing the paper negative; and
   f. exposing the paper negative to a printing plate, wherein said digitally composing further includes:
   (a1) in each halftone, increasing the size of each highlight dot and decreasing the size of each shadow dot.

8. The process recited in claim 7, wherein said configuring the RIP further includes:
   (b1) configuring a raster image processor (RIP), coupled to the imagesetter, for negative output.

9. The process recited in claim 7, wherein said configuring the RIP further includes:
   (b1) configuring a raster image processor (RIP), coupled to the imagesetter, for positive output, and configuring page composition software coupled to the RIP for negative output.

10. The process recited in claim 7, wherein said operating further includes:
    (c1) increasing the intensity of a laser in the imagesetter.

11. The process recited in claim 7, wherein step (d) further includes:
    (d1) increasing the exposure time of the paper negative by an amount approximately equal to the difference in opacity of the imagesetting paper compared to imagesetting film.

12. The process recited in claim 7, wherein step (d) further includes:
    (d1) increasing the exposure light intensity on the paper negative by an amount approximately equal to the difference in opacity of the imagesetting paper compared to imagesetting film.

13. The process recited in claim 7, wherein step (d) further includes:
    (d1) increasing the exposure time of, and the exposure light intensity on, the paper negative by an amount approximately equal to the difference in opacity of the imagesetting paper compared to imagesetting film.

14. The process recited in claim 7 wherein said digitally composing includes increasing the size of each highlight dot by approximately five percent and decreasing the size of each shadow dot by approximately five percent.

* * * * *